US006376880B1

(12) United States Patent
Holst

(10) Patent No.: US 6,376,880 B1
(45) Date of Patent: Apr. 23, 2002

(54) HIGH-SPEED LATERAL BIPOLAR DEVICE IN SOI PROCESS

(75) Inventor: John C. Holst, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/406,451

(22) Filed: Sep. 27, 1999

(51) Int. Cl.$^7$ ................................................ H01L 27/81
(52) U.S. Cl. ..................... 257/347; 257/347; 257/362; 257/517; 257/518; 257/525; 257/526; 257/537
(58) Field of Search ............................... 257/347, 362, 257/517, 518, 525, 526, 539

(56) References Cited

U.S. PATENT DOCUMENTS

| | | | |
|---|---|---|---|
| 4,922,315 A | 5/1990 | Vu | |
| 5,070,030 A | 12/1991 | Ikeda et al. | |
| 5,185,280 A | 2/1993 | Houston et al. | |
| 5,298,779 A | * 3/1994 | Nouailhat et al. | 257/273 |
| 5,315,144 A | 5/1994 | Cherne | |
| 5,420,055 A | 5/1995 | Vu et al. | |
| 5,587,599 A | 12/1996 | Mahnkopf et al. | |
| 5,846,858 A | 12/1998 | Kerber | |
| 6,180,985 B1 | * 1/2001 | Yeo | 257/354 |
| 6,194,763 B1 | * 2/2001 | Hisamoto et al. | 257/353 |

FOREIGN PATENT DOCUMENTS

| | | |
|---|---|---|
| EP | 0 616 370 A2 | 9/1994 |
| JP | 02003238 | 1/1990 |
| JP | 04116935 | 4/1992 |

OTHER PUBLICATIONS

PCT International Search Report, for Advanced Micro Devices, Inc., International Application No. PCT/US00/20958, International Filing Date Jan. 8, 2000, 5 pages.

"An Ultra Low Power Lateral Bipolar Polysilicon Emitter Technology on SOI", IEDM 93–75, 1993 IEEE, pp. 4.4.1–4.4.4.

"A Novel High–Performance Lateral Bipolar on SOI", IEDM 91–663, 1991 IEEE, pp. 26.1.1–26.1.4.

\* cited by examiner

Primary Examiner—Eddie Lee
Assistant Examiner—Edgardo Ortiz
(74) Attorney, Agent, or Firm—Eschweiler & Associates, LLC

(57) ABSTRACT

A lateral bipolar transistor includes a semiconductor layer overlying an electrically insulating material and an insulating layer overlying a central portion of the semiconductor layer. A contact hole resides in the insulating layer and a conductive material overlies the insulating layer and makes electrical contact with the semiconductor layer through the contact hole, thereby forming a base contact. The semiconductor layer has a first conductivity type in a central region which substantially underlies the conductive material, and has a second conductivity type in regions adjacent the central region. The first region forms a base region and the adjacent regions form a collector region and an emitter region, respectively. A method of forming a lateral bipolar transistor device is also disclosed. The method includes forming a semiconductor layer over an insulating material and forming an insulating layer over the semiconductor material. A base contact hole is then formed in the insulating layer and a conductive base contact region is formed over a portion of the insulating layer. The base contact region overlies the base contact hole and makes an electrical connection to a middle portion of the semiconductor layer, which corresponds to a base region. Lastly, a collector region and an emitter region are formed on opposite sides of the base region such that the collector region and the emitter region are adjacent the base region, respectively.

11 Claims, 7 Drawing Sheets

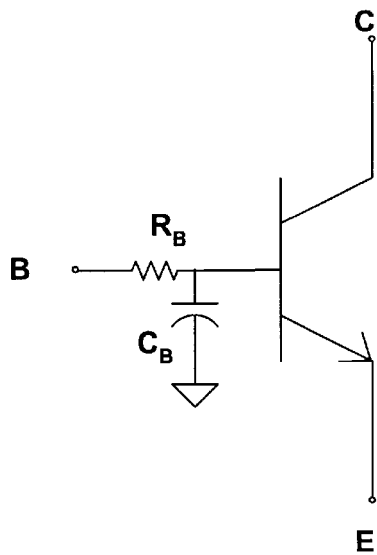
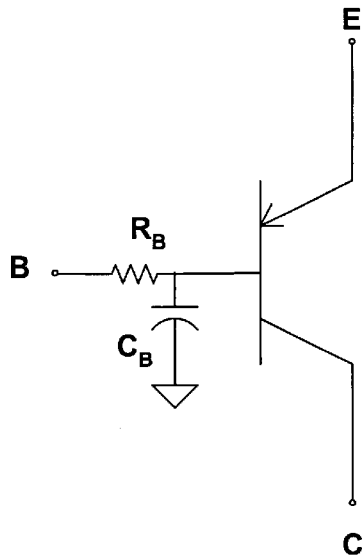
FIG. 3a
(PRIOR ART)
FIG. 3b
(PRIOR ART)
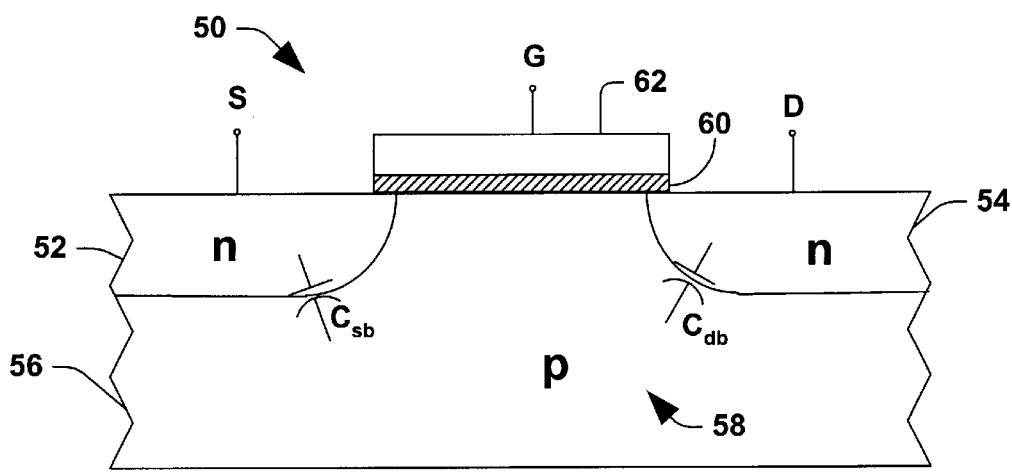
FIG. 4
(PRIOR ART)

HIGH-SPEED LATERAL BIPOLAR DEVICE IN SOI PROCESS

FIELD OF THE INVENTION

The present invention generally relates to semiconductor devices and semiconductor processing. More particularly, the present invention relates to a device structure and method of manufacture which uses an SOI MOS type architecture to generate a high performance lateral bipolar transistor, wherein the transistor exhibits a controllable, high gain without a corresponding degradation in base resistance.

BACKGROUND OF THE INVENTION

Integrated circuits utilize a variety of circuit components to effectuate desired functions, for example, transistors, resistors, capacitors, etc. Transistors can be broadly characterized in two categories: bipolar transistors and MOSFET (field effect) transistors. Bipolar transistors and MOSFET (MOS) transistor devices operate under different physical principles, however, both are used as either amplifying or switching devices. In the first application, the transistor's function is to accurately amplify small ac signals; in the second, the transistor operates as a switch, turning from an ON state to an OFF state and back. The above transistor functions exist because of "transistor action," which will be briefly discussed below.

A simplified cross section diagram and corresponding schematic representation of an npn-type bipolar transistor is illustrated in prior art FIGS. 1a and 1b, designated by reference numeral 10. The transistor 10 of prior art FIG. 1a is an npn-type bipolar transistor and is composed of doped semiconductor material regions, wherein n-type regions have electrons as their majority carriers while p-type regions employ holes as their majority carriers. The transistor 10 has a collector region 12, a base region 14, and an emitter region 16, respectively.

The npn bipolar transistor of FIG. 1a generally works in the following manner. When a forward biased voltage is applied to the base-emitter junction, a large number of electrons are injected into the base 14 from the emitter 16. If the distance between the emitter 16 and the collector 12 is sufficiently small (i.e., the base 14 is thin), the electrons will reach the collector 12 prior to recombination. Even if the junction between the base 14 and the collector 12 is reverse biased, the electric field at that location will sweep the electrons across the junction and the electrons will be "collected" by the collector 12. This phenomena gives rise to a collector current ($I_C$) which is almost as large as the forward-biased current at the base-emitter junction ($I_E$) Therefore, a large current will flow in a reverse-biased junction (i.e., the base-collector junction) due to the existence of a nearby forward-biased junction (i.e., the base-emitter junction) if the size of the base 14 is dimensioned appropriately. This phenomena is called bipolar transistor action.

Not all of the electrons injected into the base 14 will arrive at the collector 12. Some of the electrons will recombine in the base region 14 as they travel therethrough. Clearly, as the size of the base region 14 varies, the amount of recombination will also vary, thus impacting the "collection efficiency" of the transistor. The recombination phenomena, along with the injection of holes from the emitter 16 into the base 14, forms the base current. The base region 14 (both its dopant concentration and its size) thus plays an important role in the performance of the bipolar transistor 10, as evidenced by the common-emitter current gain β, given by:

$$\beta = I_C/I_B.$$

Note that as $I_B$ decreases, the transistor gain increases, which is advantageous for both analog type circuit applications (for amplification) and digital circuit applications (for switching speed). Therefore it is desirable (for the sake of improved transistor gain) to make the base region 14 as thin as possible.

FIG. 2 is a fragmentary cross section diagram illustrating a prior art vertical pnp-type bipolar transistor 20. The transistor 20 has a p-type collector region 22, such as a p-well or the substrate, in which an n-type base region 24 is formed. A p-type emitter region 26 is then formed in the base region 24, typically via deposition or ion implantation. In such a vertical structure (which is the conventional configuration for many bipolar transistor integrated circuits), the base thickness ($d_B$) is limited disadvantageously by the ability to control the depths of the base region 24 and the emitter region 26, respectively. Consequently, obtaining a controllable, high transistor gain is difficult.

Another characteristic which impacts the performance of bipolar transistors is the effective base resistance. Schematically, the base resistance is illustrated in prior art FIGS. 3a and 3b, respectively. The base resistance ($R_B$) results in a switching delay of the transistor as a function of the RC time constant (wherein RC corresponds to $R_B C_B$ as illustrated). Referring, for example, to prior art FIG. 2, the base resistance $R_B$ consists of the resistivity of the n-type base region 24 (which is a function of its doping concentration) and the area associated with the minimum space ($d_B$) between the collector region 22 and the emitter region 26, respectively.

From the above discussion, its becomes clear that as the spacing $d_B$ decreases (which is advantageous for transistor gain), the base resistivity increases (which is disadvantageous for base resistance). Consequently, traditional bipolar transistor structures often demand a design performance trade-off between transistor gain and base resistance. Therefore there is a need in the art for a bipolar transistor device and a method of manufacture which overcomes the problems associated with the prior art.

SUMMARY OF THE INVENTION

The present invention relates to a lateral bipolar transistor structure and a method of manufacture which provides a high, controllable gain characteristic without a substantial base resistance performance trade-off as is typical in conventional bipolar transistor structures.

The transistor structure of the present invention is preferably formed in a semiconductor material which overlies an insulating layer and thus constitutes a silicon-on-insulator (SOI) device. The lateral bipolar transistor is similar in some respects to a conventional MOS transistor device, however, several significant differences exist. A conductive base contact material (similar to a MOS gate electrode) is formed over an insulating layer (similar to a gate oxide) which overlies the semiconductor material. The conductive base contact material is electrically connected to a portion of the semiconductor material (which forms a base region of the transistor device) through a contact hole in the insulating layer. The collector region and the emitter region are then formed in the semiconductor layer and are self-aligned with respect to the base contact (similar to the way in which drain and source regions are self-aligned with respect to the gate).

The lateral bipolar transistor of the present invention provides for a high transistor gain by forming a very thin base region in a controllable manner. By using the base contact which can be controlled relatively tightly to self-align the collector and emitter regions, the base thickness can be tightly controlled by the base contact width. By varying the thickness of the conductive feature which constitutes the base contact, a designer can form the transistor with an easily tunable, large transistor gain with the extremely thin base region in a controlled, repeatable manner. Because the lateral bipolar transistor is analogous in some respects to a traditional MOS-type device, the base thickness is analogous to the channel length in a MOS transistor.

In addition, the lateral bipolar transistor of the present invention provides a large transistor gain without negatively increasing the transistor base resistance. Because the base contact electrically contacts the base region through an insulating layer which is analogous to a MOS-type gate oxide, the transistor can extend in the transistor "width" direction a sufficient length so as to reduce the transistor base resistance to an acceptable level. That is, the lateral bipolar transistor can be extended in a second dimension which is generally perpendicular to the base thickness dimension to increase the area of the base region between the collector and emitter regions, respectively.

The present invention is also directed to a method of manufacture of a lateral bipolar transistor device. The method includes the step of forming an insulating layer over an SOI material and forming a base contact hole in the insulating layer. A base contact is then formed in a region overlying the base contact hole of the insulating layer. Collector and emitter regions are then formed in the SOI material, using the base contact to self-align the collector and emitter regions, respectively, and defining a base region therebetween. The thickness of the base contact thus substantially defines the thickness of the base region which dictates, at least in one respect, the gain of the lateral bipolar transistor. The method further includes forming the base contact along an entire width of the transistor device, thereby increasing the area between the collector and emitter without adversely impacting the base region thickness.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1b is a prior art schematic diagram illustrating the bipolar transistor device of prior art FIG. 1a;

FIGS. 3a and 3b are prior art schematic diagrams illustrating npn and pnp bipolar transistors and the base resistance and base capacitance associated therewith for illustrating a manner in which the base resistance impacts the performance of a bipolar transistor device;

FIG. 4 is a fragmentary cross section diagram illustrating a conventional MOS transistor structure and the substantial junction capacitance associated therewith;

DETAILED DESCRIPTION OF THE INVENTION

Figure 1A:
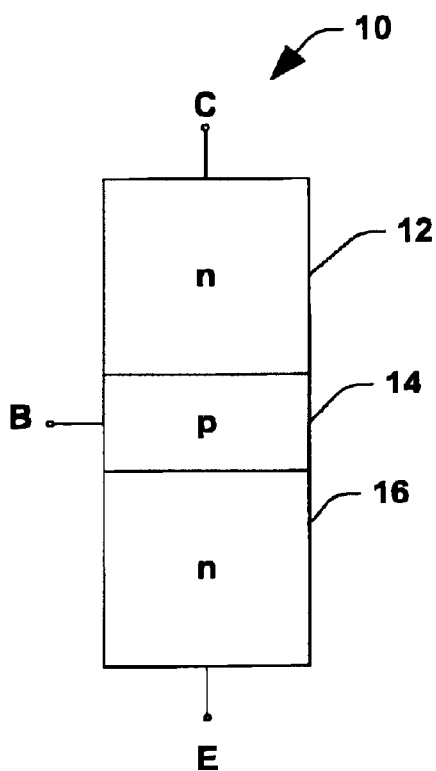
FIG. 1a is a prior art simplified one-dimensional cross section of a bipolar transistor device.
Figure 1B:
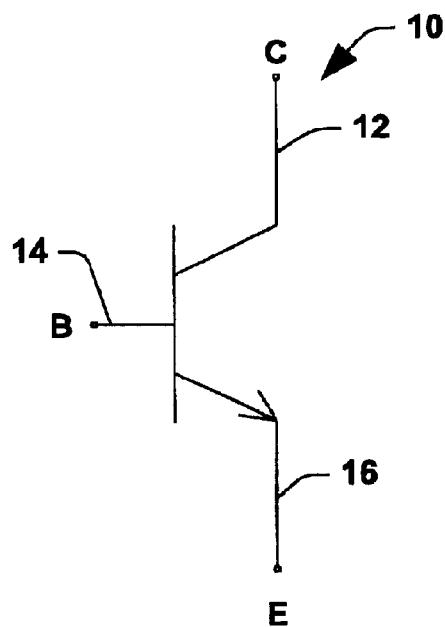
Figure 2:
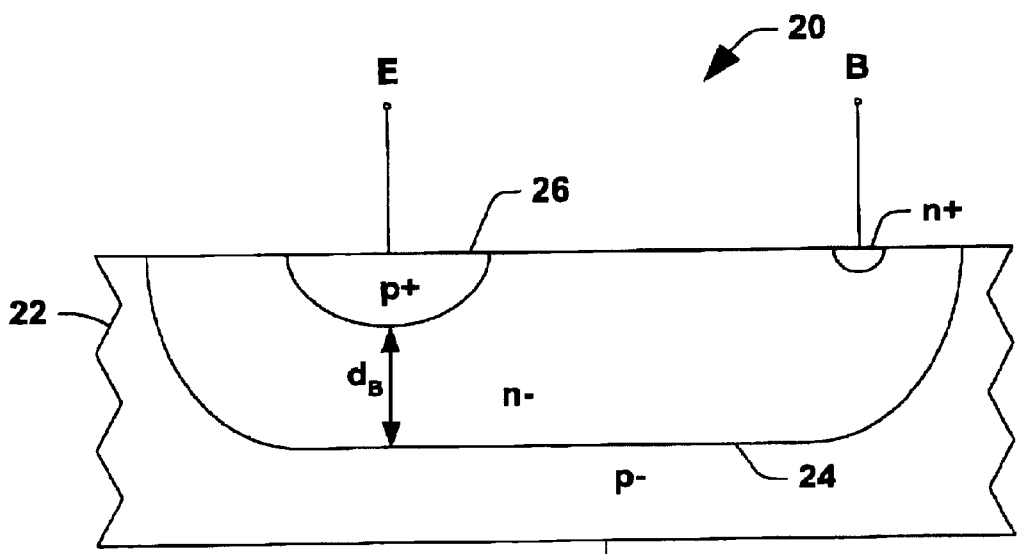
FIG. 2 is a fragmentary cross section diagram illustrating a conventional vertical bipolar transistor device and the difficulty in controlling the base thickness ($d_B$) which is associated with bipolar transistor gain.

The present invention is directed toward a lateral bipolar transistor structure and a method of manufacture which has some similarities to MOS-type transistor structures. Because the lateral bipolar transistor of the present invention shares some such similarities, a brief description of prior art MOS-type transistors is provided in order to more fully appreciate the problems of the prior art and the manner in which the present invention addresses such problems.

A conventional enhancement-type MOS transistor is illustrated in FIG. 4 and is designated at reference numeral 50. The MOS transistor 50 is an n-channel transistor and includes n-type source and drain regions 52 and 54 in a p-type body 56, which may also be the bulk substrate. A region 58 between the source and drain regions 52 and 54 is a channel region, over which is formed a gate oxide 60 and a control gate electrode 62, often formed of doped polysilicon. When zero volts is applied to the gate electrode 62, the electrical path from the source 52 to the drain 54 consists of two back-to-back diodes in series, which prohibit any current flow therebetween. By applying a positive voltage to the gate electrode 62, electrons in the body 56 are attracted into the channel region 58 under the gate oxide 60 to form a channel between the source 52 and the drain 54. Once the gate voltage reaches a threshold voltage value ($V_t$), the channel is filly formed and the MOS transistor 50 becomes conductive.

The MOS transistor 50 is commonly used as a switch by applying differing voltage values to the gate electrode 62. The switching speed of the MOS transistor 50 is an important characteristic because it dictates, at least in one respect, how fast circuits which employ the MOS transistor 50 will operate. Presently, the switching speed of a transistor is not limited by the channel transit time (i.e., the time required for charge to be transported across the channel); instead, the switching speed is limited by the time required to charge and discharge the capacitances that exist between the device electrodes and between the interconnecting conductive lines and the substrate.

One way of appreciating the transistor capacitances is through the exemplary cross section illustrated in prior art FIG. 4. As seen in prior art FIG. 4, capacitances exist between the various device electrodes (not shown) and between the electrodes and the body region. The drain-to-body capacitance ($C_{db}$) and the source-to-body capacitance ($C_{sb}$) are illustrated in prior art FIG. 4 and are referred to often as junction capacitances. The value of the junction capacitances are a function of both the cross sectional area of the junctions as well as the doping concentrations of the regions, respectively.

Figure 5:
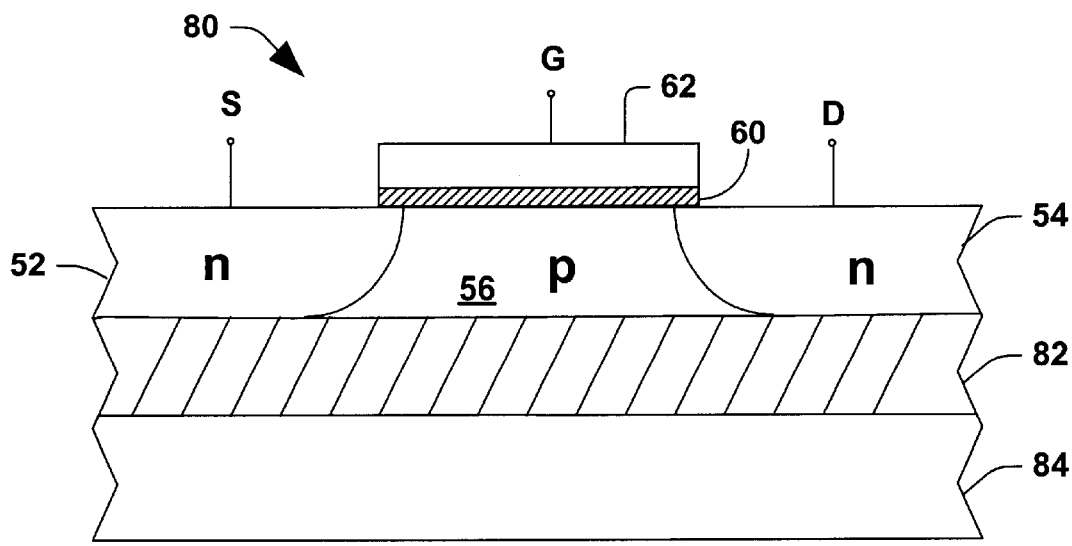
FIG. 5 is a fragmentary cross section diagram illustrating a conventional MOS SOI transistor structure.
Figure 6:
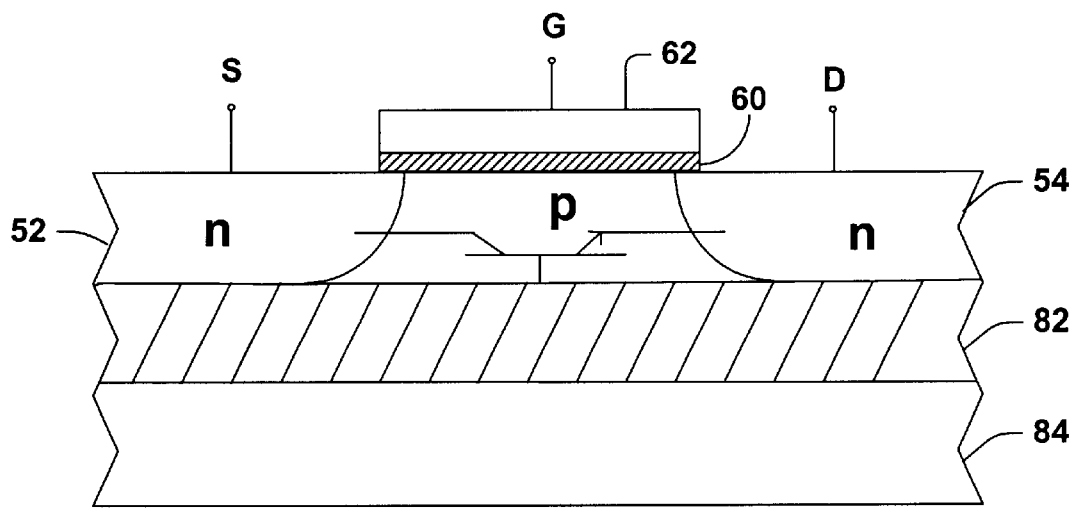
FIG. 6 is a fragmentary cross section diagram illustrating the parasitic lateral bipolar transistor which can turn on in a conventional MOS SOI transistor structure when the body region is allowed to float.

One attempt to increase the performance of the MOS transistor 50 of prior art FIG. 4 reduces the junction capacitances by forming the transistor on an insulating region. Such a transistor device structure is called a silicon-on-insulator (SOI) device and is illustrated in prior art FIG. 5. The SOI MOS transistor, designated at reference numeral 80, has components similar to the transistor 50 of prior art FIG. 4. In the SOI transistor 80, however, the body 56 is not formed in the bulk semiconductor material as in FIG. 4, but rather overlies an insulating layer 82 such as silicon dioxide ($SiO_2$). The insulating layer 82, in turn, overlies a bulk semiconductor material or substrate 84.

The SOI transistor 80 provides several performance advantages over traditional bulk transistor devices. Initially, since each device can be completely isolated from one another (as opposed to sharing a common body), better individual device isolation is achieved, which prevents circuit latch-up conditions. In addition, since at least a portion of the source region 52 and the drain region 54 abut the insulating layer 82, the cross sectional area of the source/body and drain/body interfaces is reduced and thus the junction capacitance also is significantly reduced.

Although SOI MOS devices 80 provide several advantages over prior art MOS bulk type devices 50, SOI transistors also have several disadvantages. One disadvantage of SOI transistors could be (depending upon the application) the lack of bulk silicon or body contact to the transistor. In some cases it is desirable to connect the SOI body region 56 to a fixed potential in order to avoid "floating body effects." Use of a body contact for each transistor device, however, undesirably increases the device size and thus is not an amenable solution.

The floating body effects of an SOI transistor refer generally to various hysteresis effects which are associated with the body 56 being allowed to float relative to ground. Two such floating body effects include the "kink" effect and the parasitic lateral bipolar effect. The "kink" effect originates from impact ionization. When the SOI transistor 80 is operated at a relatively high drain-to-source voltage, channel electrons having a sufficient kinetic energy cause an ionizing collision with the lattice, resulting in carrier multiplication near the drain end of the channel 58. The generated holes build up in the body 56 of the device 80, thereby raising the body potential. The increased body potential reduces the threshold voltage of the transistor 80, thus increasing the transistor current, which results in a "kink" in the transistor current/voltage (I/V) curves.

The second floating body effect includes the parasitic lateral bipolar effect. As discussed above, if impact ionization generates a large number of holes, the body bias may be raised to a sufficient voltage so that the source/body p-n junction becomes forward biased. When this junction becomes forward biased, minority carriers are emitted into the body 12 which causes a parasitic lateral npn bipolar transistor to turn on. Such parasitic bipolar transistor action leads to a loss of gate control of the transistor current and is therefore highly undesirable in MOS transistor applications.

In the past, therefore, steps have been taken to mitigate or altogether eliminate the impact of the parasitic bipolar effect on the performance of the SOI MOS transistor 80. For example, one methodology disclosed in U.S. Pat. No. 5,420,055 adds an implantation step in which material is implanted near the p-n junction in order to from a relatively high concentration of recombination centers where electrons and holes can recombine. Such recombination centers are generated electron traps or crystalline structure defects. Such a device construction is intended to discharge the build-up of holes in the body region 56, and thus prohibit the parasitic bipolar transistor from "triggering" or turning on. In another prior art solution discussed in U.S. Pat. No. 5,315,144, the gain of the parasitic lateral bipolar transistor is reduced by substantially reducing the doping concentrations in the source and drain regions, respectively. In either of the above cases, however, the parasitic lateral bipolar transistor in the SOI MOS device 80 has been viewed as a problem to be constrained or altogether eliminated.

According to the present invention, it has been appreciated that instead of trying to eliminate the parasitic lateral bipolar transistor in MOS SOI devices, the lateral bipolar transistor characteristics in such a MOS-type structure could be exploited and used to fashion a high performance bipolar device which overcomes some of the performance design trade-offs inherent in conventional bipolar transistor structures. In particular, the present invention contemplates a bipolar transistor structure that can provide a large transistor gain in a reproducible manner without negatively increasing the transistor base resistance.

The present invention is directed to a lateral bipolar SOI transistor that resembles, at least in one respect, a conventional MOS-type SOI transistor, except that the gate oxide has a base contact hole and the gate electrode acts as a base contact which electrically contacts the base region thereunder through the base contact hole. The base contact then is used to self-align the collector and emitter regions and thus the base thickness is well controlled and dictated by the base contact feature size. In addition, the base contact may extend along the full "width" of the transistor and thus provides for high transistor gain without increased base resistance, thereby overcoming the heretofore gain/base resistance performance trade-off inherent in conventional bipolar transistor structures.

Figure 7:
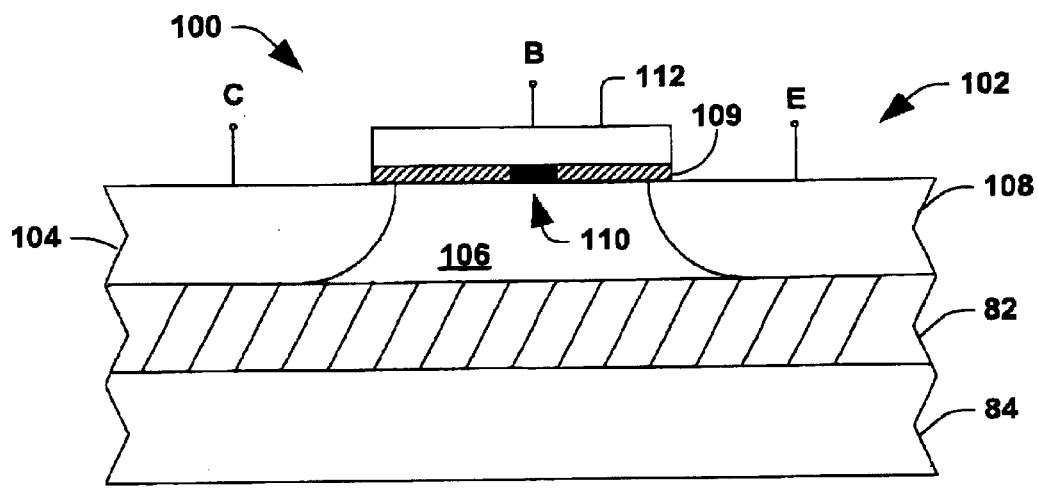
FIG. 7 is a fragmentary cross section diagram illustrating a lateral bipolar transistor structure according to the present invention.

Turning again to the Figures., FIG. 7 is a fragmentary cross section diagram illustrating a lateral bipolar transistor 100 according to the present invention. The bipolar transistor 100 is an SOI device having the insulating layer 82 overlying the bulk substrate 84. A semiconductor layer 102 overlies the insulating layer 82 and has three distinct portions which are adjacent each other. Such portions include a collector region 104, a base region 106 and an emitter region 108, respectively. An insulating region 109 overlies the semiconductor layer 102 and has a conductive portion 110 therein which makes electrical contact to the base region 106. A conductive base contact 112 overlies the insulating region 108 and couples to the base region 106 through the conductive portion 110.

Figure 8A:
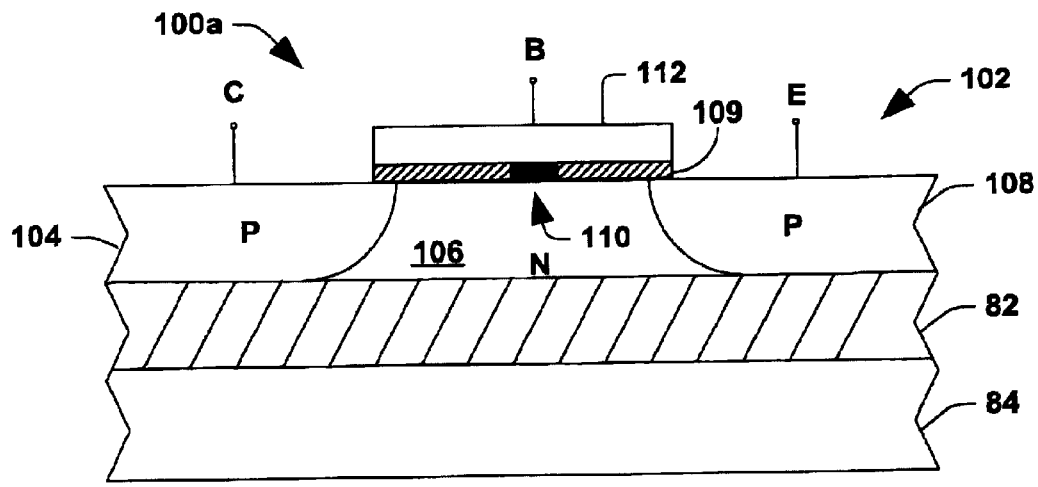
FIG. 8a is a fragmentary cross section diagram illustrating a pnp type lateral bipolar transistor structure according to the present invention.
Figure 8B:
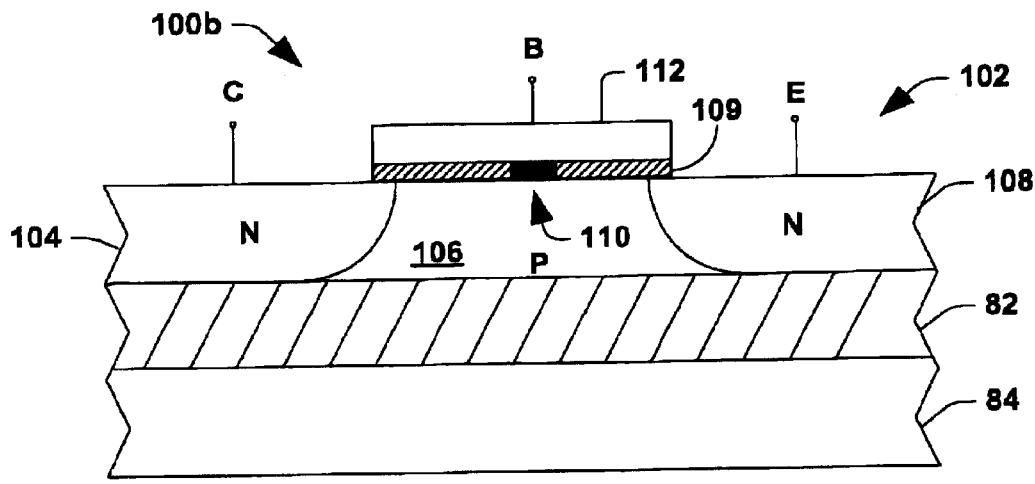
FIG. 8b is a fragmentary cross section diagram illustrating an npn type lateral bipolar transistor structure according to the present invention.

According to the present invention, the transistor 100 may be a pnp lateral bipolar transistor 100a or an npn lateral bipolar transistor 1006, as illustrated in FIGS. 8a and 8b, respectively. In each case, however, the collector and emitter regions 104 and 108 are of a first conductivity type while the base region 106 is of a second, different conductivity type.

Returning to FIG. 7, it is seen that the collector and emitter regions 104 and 108 are adjacent the base region 106, thus making the transistor 100 a lateral transistor structure. Preferably, the collector and emitter regions 104 and 108 are self-aligned with respect to the base contact 112. In such an instance, the base contact 112 is defined via, for example, deposition and etching prior to formation of the collector and emitter regions 104 and 108. The formation of the collector and emitter regions 104 and 108, then uses the base contact 112 to define the distance therebetween, thus also defining the base thickness or "length" of the bipolar transistor 100 (which may be considered analogous to the channel length of a conventional MOS transistor structure). As discussed supra, the base thickness is an important factor in determining the transistor gain. Therefore the structure of the bipolar transistor of the present invention allows for a well controlled base thickness that does not rely on junction depths, as in conventional vertical bipolar devices. In addition, the base thickness of the present invention can be made as small as the base contact 112 feature size. As lithography techniques continue to improve, the base contact 112 will continue to decrease, thereby allowing the base thickness to continue to shrink accordingly, in a controlled manner.

Figure 9:
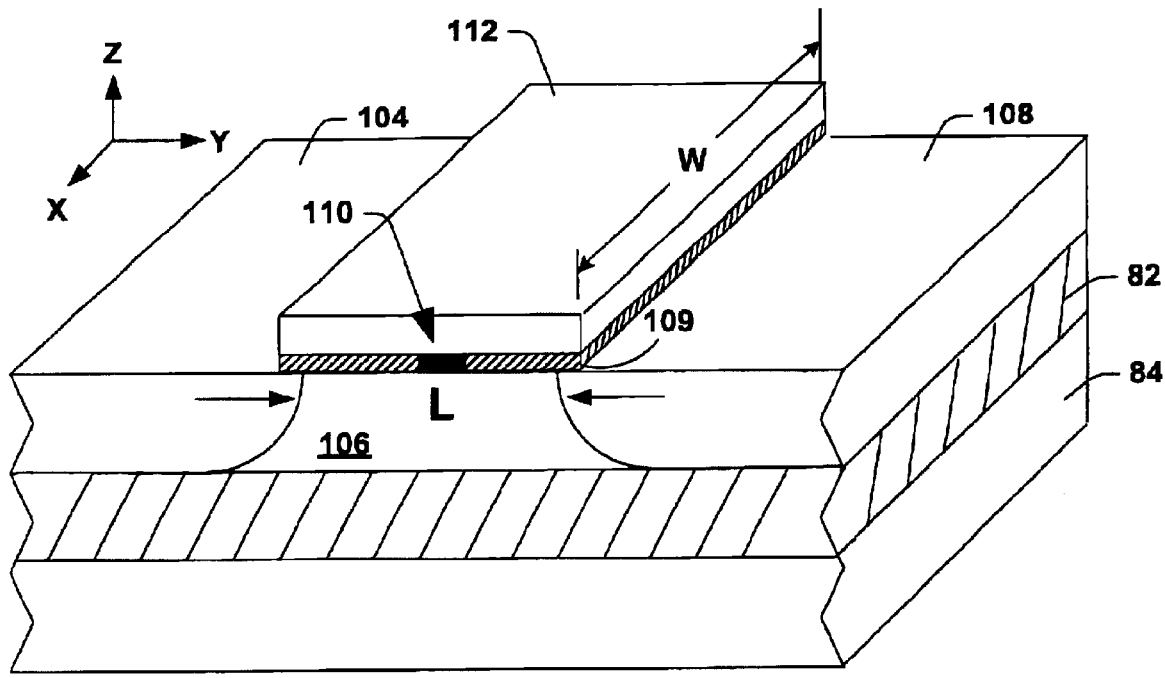
FIG. 9 is a fragmentary perspective view of a lateral bipolar transistor according to the present invention, wherein the base contact extends substantially along the entire width of the bipolar transistor, thereby decreasing the base resistance thereof.
Figure 10:
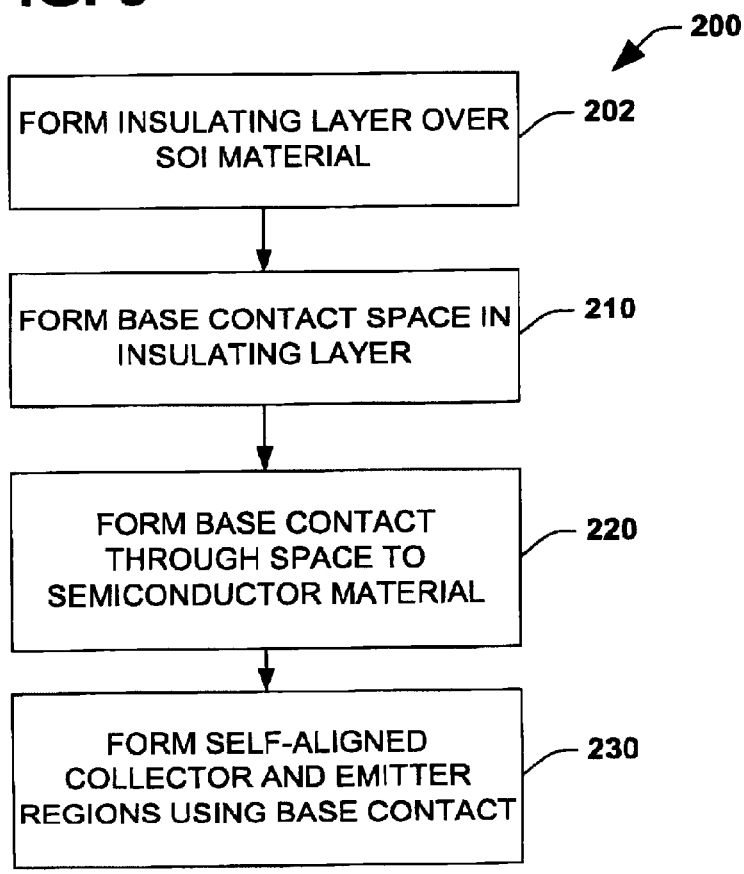
FIG. 10 is a flow chart diagram illustrating a method of forming a lateral bipolar transistor according to the present invention.

According to another aspect of the present invention, a perspective, fragmentary diagram of the lateral bipolar transistor 100 is illustrated in FIG. 9. As discussed supra, one disadvantage of conventional bipolar transistor structures was the performance trade-off between transistor gain and transistor base resistance. More particularly, as the base thickness was decreased in conventional structures to advantageously increase the transistor gain, the decreased base thickness disadvantageously increased the transistor base resistance. The perspective view of FIG. 9 illustrates how the bipolar transistor structure 100 of the present invention overcomes the design trade-off inherent in the conventional structures.

As seen in FIG. 9, the base contact 112 may be formed to extend in the "X" direction as long as desired. The extension of the base contact 112 in the "X" direction is analogous to the "width" of a conventional MOS-type transistor and therefore this feature will be referred to hereinafter as the base contact width (W). By extending the base contact width (W) to a larger dimension, the total area between the active collector region 104 and the emitter region 108 is increased which advantageously decreases the base resistance. Since the transistor 100 can be formed with any size width (W), the base resistance can be customized for varying levels of performance, as may be desired.

The base resistance is a rather complex parameter which generally is composed of the base series resistance and the base-spreading resistance. The base series resistance in conventional, vertical devices generally is associated with the resistance path between the base contact and the edge of the emitter region, while the base-spreading resistance generally is the resistance between the edge of the emitter region and the active part of the base region where the current actually flows during conduction. Consequently, the two-dimensional (X-Y) effects of the base-spreading resistance are important. By having a substantial transistor width (W), the current is distributed along the "wide" emitter which reduces the current density at any one point. Clearly then, the lateral bipolar transistor 100 of the present invention allows flexibility in tailoring the transistor base-spreading resistance (and thus a significant contribution to the total base resistance) independently of transistor gain.

Figure 11A:
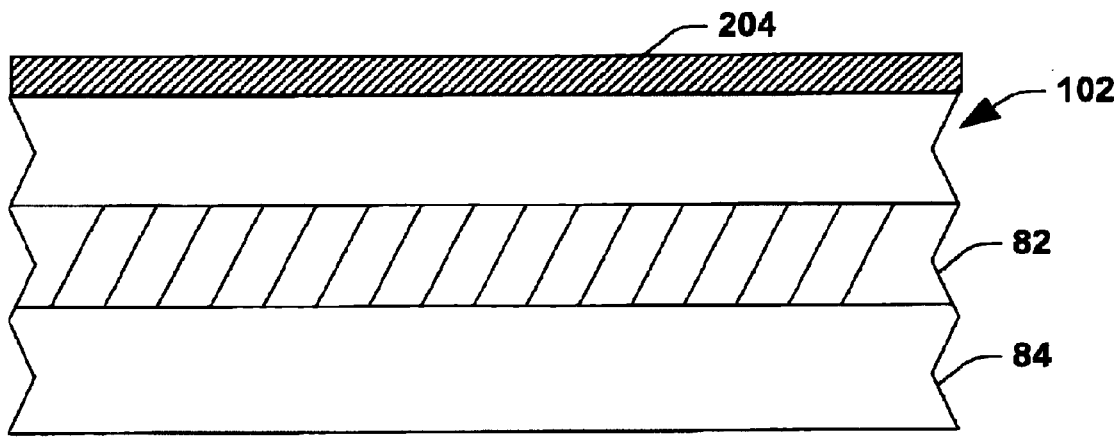
FIGS. 11a–11d are fragmentary cross section diagrams illustrating steps of forming a lateral bipolar transistor according to an exemplary embodiment of the present invention.

A method 200 of forming the lateral bipolar transistor 100 of FIG. 7 is illustrated in FIGS. 10 and 11a–11d. The method 200 begins at step 202 by forming an insulating layer 204 over a surface of an SOI material, as illustrated in FIG. 11a. Such an SOI material may be, for example, the silicon substrate 84 having an insulating layer 82 thereon formed via either deposition or deep implantation. In the case of deposition, another semiconductor layer 102 is formed thereover via, for example, deposition. Alternatively, if the insulating layer 82 is formed via deep implantation, the layer 102 thereover is the top portion of the substrate bulk material. Preferably, the insulating layer 204 formed over the semiconductor layer 102 is silicon dioxide and is formed via oxide growth in a furnace and may vary substantially in thickness. Alternatively, however, other insulating materials such as silicon nitride and other methods of formation, for example, deposition, may be used and are contemplated as falling within the scope of the present invention.

Figure 11B:
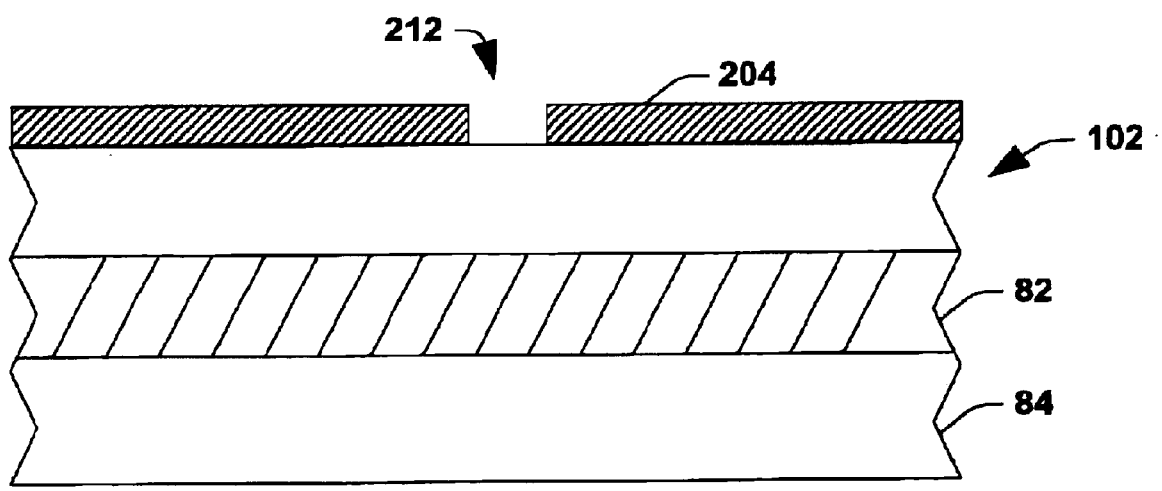
Figure 11C:
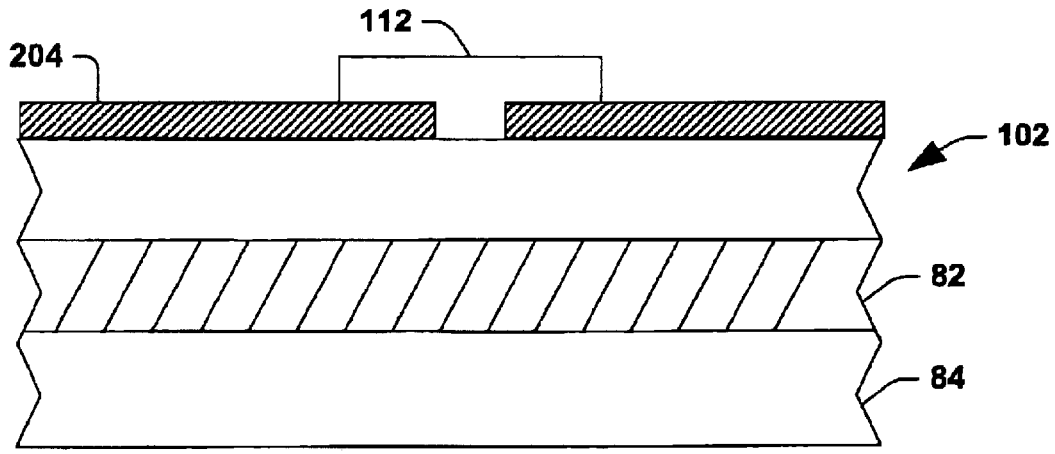

The method 200 continues at step 210 by forming a base contact hole 212 in the insulating layer 204, as illustrated in FIG. 11b. The base contact hole 212 is formed preferably by etching, however, any manner of selectively removing a portion of the insulating layer 204 corresponding to the hole 210 may be utilized and is contemplated as falling within the present invention. Preferably, a generally isotropic etch is used to give generally non-vertical sidewalls in the insulating layer 204 at the hole 212 to encourage good step coverage later in the transistor forming process. Alternatively, however, depending on the size of the base contact hole 212 and the depth of the insulating layer 204, poor step coverage in the hole 212 may not be an issue and an anisotropic etch may be utilized.

The base contact 112 is then formed at step 220 by depositing a conductive film 222 over the insulating layer 204 via, for example, vapor deposition or sputtering. The conductive film may be doped polysilicon or a metal, for example, aluminum, as may be desired. Any conductive material may be used and is contemplated as falling within the scope of the present invention. The conductive film 222 is then patterned to define the base contact 112 via, for example, etching. Preferably, a thickness or "length" of the base contact 112 will depend upon the desired transistor gain. That is, for a relatively small transistor gain, the base contact is patterned to be relatively wide, while for a relatively large transistor gain the base contact 112 is patterned to be generally thin, as discussed supra. In addition, the width of the base contact 112 is formed based on the desired base resistance. That is, for a high base resistance, the width (W) is relatively small, while for a lower base resistance, the width (W) is relatively large.

Figure 11D:
Figure 11D:
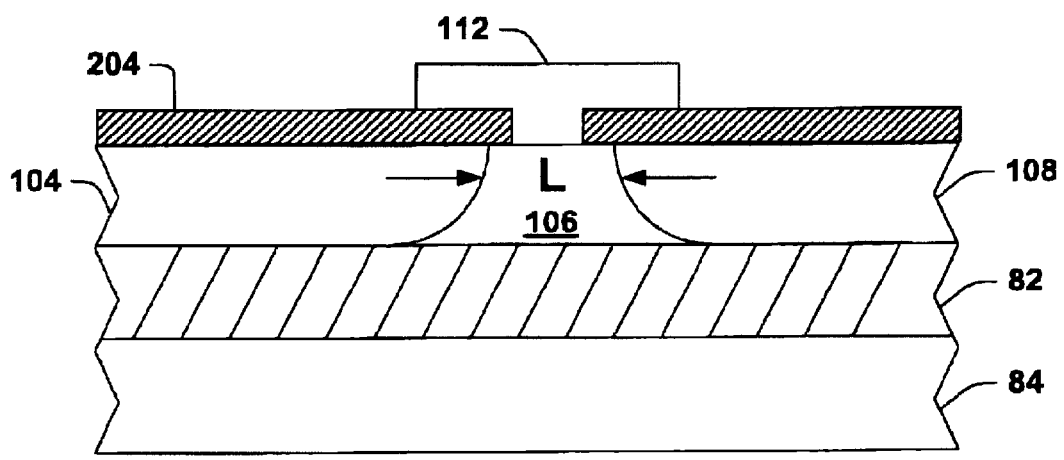

Subsequently, the method 200 proceeds to step 230, wherein the collector, base and emitter regions are defined, respectively. Preferably, the semiconductor layer 102 is initially doped with one conductivity type prior to step 202; then step 230 includes forming the regions 104, 106 and 108 using a single formation step, for example, ion implantation. In such a case, the implantation step 230 is another conductivity type which is different than that of the semiconductor layer 102. In such a manner, the collector region 104 and the emitter region 108 are self-aligned with respect to the base contact 112. Further, the formation step 230 defines the base thickness (L), as illustrated in FIG. 11d.

After formation of the collector, base and emitter regions 104, 106 and 108, portions of the exposed insulating layer 204 may be removed to result in the insulating region 109 of FIG. 7. Although FIG. 11d illustrates step 230 occurring through the insulating layer 204, alternatively, exposed portions of the layer 204 may be removed and then the implantation can occur, as may be desired.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A lateral bipolar transistor, comprising:
   a semiconductor layer overlying an electrically insulating material; and
   an insulating layer overlying a central portion of the semiconductor layer, wherein a contact hole resides therein, and wherein a conductive material overlies the insulating layer and makes electrical contact with the semiconductor layer through the contact hole, thereby forming a base contact;
   the semiconductor layer having a first conductivity type in a central region substantially underlying the conductive material, and having a second conductivity type in regions adjacent the central region, wherein the first region forms a base region and the adjacent regions form a collector region and an emitter region, respectively, wherein the base region has a length or a thickness defined by a distance between the collector region and the emitter region and a width extending in a direction substantially perpendicular to the base region length, and wherein the base contact extends along substantially the entire width of the base region, thereby minimizing a base resistance of the lateral bipolar transistor.

2. The lateral bipolar transistor of claim 1, wherein the collector region and the emitter region are self-aligned with respect to the base contact.

3. The lateral bipolar transistor of claim 1, wherein the first conductivity type is an n-type semiconductor material and the second conductivity type is a p-type semiconductor material.

4. The lateral bipolar transistor of claim 1, wherein the first conductivity type is a p-type semiconductor material and the second conductivity type is an n-type semiconductor material.

5. The lateral bipolar transistor of claim 1, wherein the insulating layer corresponds to a gate oxide layer used in a MOS-type transistor device.

6. The lateral bipolar transistor of claim 1, wherein the electrically insulating material comprises a buried silicon dioxide layer.

7. The lateral bipolar transistor of claim 1, wherein the conductive material comprises a doped polysilicon material or a metal.

8. A lateral bipolar transistor, comprising:
   a semiconductor substrate;
   an insulating layer overlying the semiconductor substrate;
   a semiconductor layer overlying the insulating layer;
   an insulating region overlying the semiconductor layer and dividing the semiconductor layer into a first region and a second region with a middle region therebetween, wherein the middle region substantially underlies the insulating region, and wherein a contact hole extends from a top portion to a bottom portion of the insulating region, thereby exposing a portion of the semiconductor layer thereunder; and
   a conductive layer overlying the insulating region and electrically contacting the middle region of the semiconductor layer via the contact hole,
   wherein the middle region has a first conductivity type and corresponds to a base region of the lateral bipolar transistor, the first region has a second conductivity type and corresponds to a collector region, and the second region has the second conductivity type and corresponds to an emitter region, and wherein the base region has a length or a thickness defined by a distance between the collector region and the emitter region and a width extending in a direction substantially perpendicular to the base region length, and wherein the conductive layer extends along substantially the entire width of the base region, thereby minimizing a base resistance of the lateral bipolar transistor.

9. The lateral bipolar transistor of claim 8, wherein the collector region and the emitter region are self-aligned with respect to the conductive layer, wherein the conductive layer is a base contact.

10. The lateral bipolar transistor of claim 8, wherein the first conductivity type is an n-type semiconductor material and the second conductivity type is a p-type semiconductor material.

11. The lateral bipolar transistor of claim 8, wherein the first conductivity type is a p-type semiconductor material and the second conductivity type is an n-type semiconductor material.

* * * * *

UNITED STATES PATENT AND TRADEMARK OFFICE
CERTIFICATE OF CORRECTION

PATENT NO. : 6,376,880 B1  Page 1 of 1
DATED : April 23, 2002
INVENTOR(S) : John C. Holst It is certified that error appears in the above-identified patent and that said Letters Patent is hereby corrected as shown below:

Column 2,
Line 4, please replace the formula "$\beta = I_C I_B$" with the formula -- $\beta = I_C/I_B$ --.

Signed and Sealed this

Eighteenth Day of June, 2002

Attest:

JAMES E. ROGAN
Attesting Officer  Director of the United States Patent and Trademark Office